United States Patent
Liechti et al.

(10) Patent No.: US 12,470,876 B2
(45) Date of Patent: Nov. 11, 2025

(54) VARIABLE RESONANT FREQUENCY ELECTROMECHANICAL DEVICE AND ASSOCIATED ACOUSTIC DEVICE

(71) Applicant: COMMISSARIAT À L'ENERGIE ATOMIQUE ET AUX ENERGIES ALTERNATIVES, Paris (FR)

(72) Inventors: Romain Liechti, Grenoble (FR); Fabrice Casset, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 154 days.

(21) Appl. No.: 18/529,717

(22) Filed: Dec. 5, 2023

(65) Prior Publication Data

US 2024/0196136 A1    Jun. 13, 2024

(30) Foreign Application Priority Data

Dec. 12, 2022 (FR) ...................................... 2213178

(51) Int. Cl.
*H04R 17/10* (2006.01)
*H04R 17/00* (2006.01)

(52) U.S. Cl.
CPC ........... *H04R 17/10* (2013.01); *H04R 17/005* (2013.01); *H04R 2201/003* (2013.01)

(58) Field of Classification Search
None
See application file for complete search history.

(56) References Cited

U.S. PATENT DOCUMENTS

| | | | |
|---|---|---|---|
| 9,980,051 B2 | 5/2018 | Clerici et al. | |
| 2012/0099746 A1* | 4/2012 | Fujise | H04R 17/00 381/190 |
| 2014/0177881 A1* | 6/2014 | Fanget | H04R 17/00 310/317 |

FOREIGN PATENT DOCUMENTS

FR     3 000 354 A1     6/2014

OTHER PUBLICATIONS

Search Report as issued in French Patent Application No. FR2213178, dated Jun. 1, 2023.

(Continued)

*Primary Examiner* — Paul W Huber
(74) *Attorney, Agent, or Firm* — Pillsbury Winthrop Shaw Pittman LLP

(57) ABSTRACT

An electromechanical device includes at least one movable mechanical structure including at least one movable mechanical element; for each movable mechanical element of each movable mechanical structure a first piezoelectric layer, the first layer being disposed on a first part of the movable element so as to be able to actuate the movable mechanical element, and a second piezoelectric layer, the second layer being disposed on a second part of the movable element, distinct from the first part, so as to be able to convert mechanical energy associated with the movement of the movable mechanical element into electric energy, the layer forming a capacitance; the device further including an electrical circuit connected to the second piezoelectric layer in parallel with the capacitance formed by the layer and including an adjustable capacitance which can assume a negative value.

13 Claims, 6 Drawing Sheets

(56) References Cited

OTHER PUBLICATIONS

Korde, U. A., et al. "The effect of a negative capacitance circuit on the out-of-plane dissipation and stiffness of a piezoelectric membrane," Smart Materials and Structures, vol. 17, No. 3, Jun. 2008, XP020137041, 13 pages.

Kodama, H., et al., "A study of sound shielding control of curved piezoelectric sheets connected to negative capacitance circuits," Journal of Sound and Vibration, vol. 311, No. 3-5, Oct. 2007, XP022453325, pp. 898-911.

\* cited by examiner

[Fig. 1]
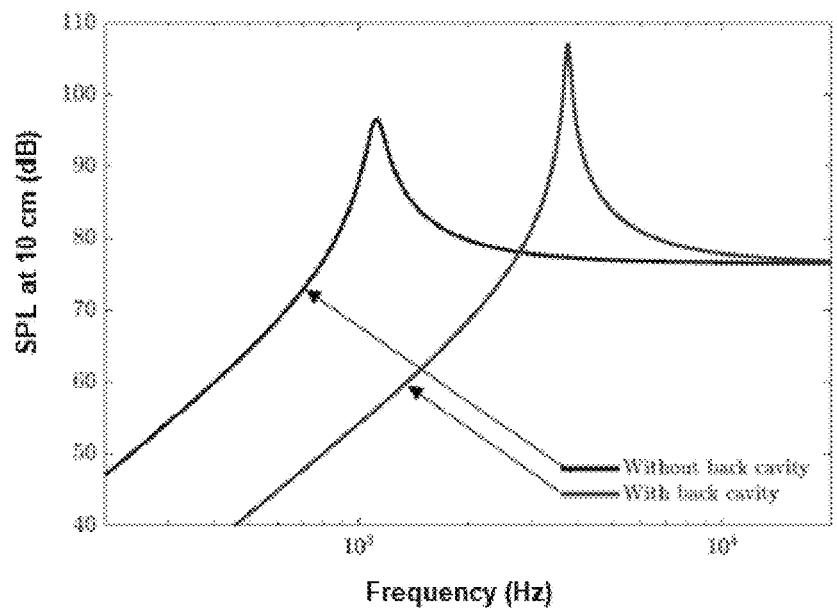
[Fig. 2]
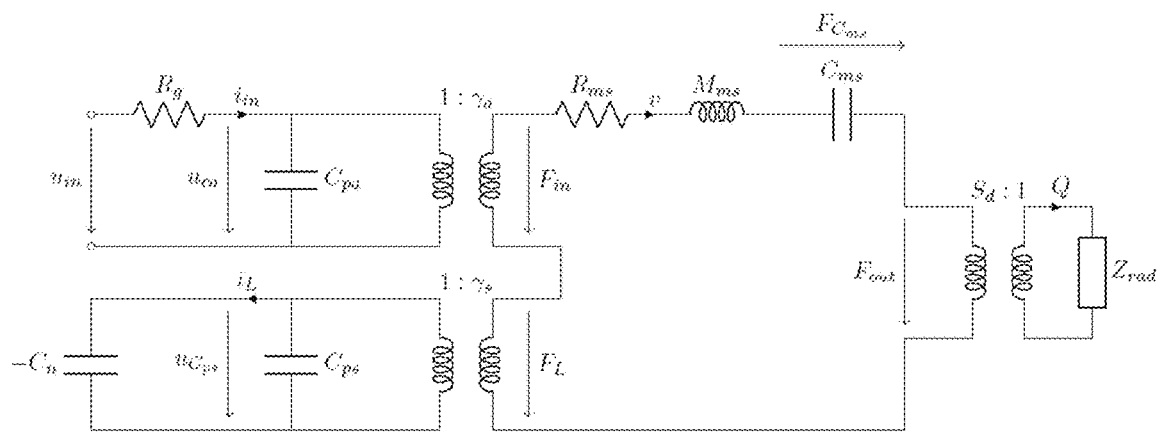

[Fig. 3]
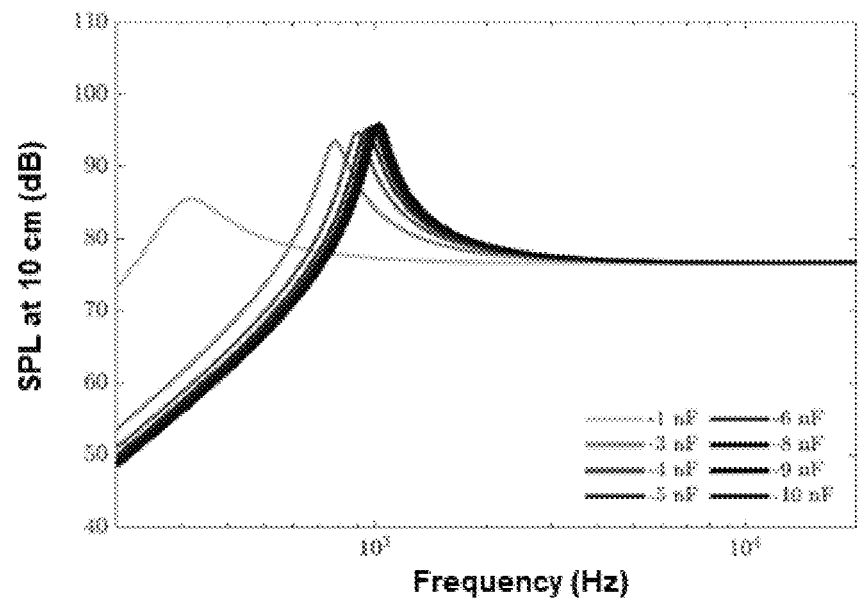
[Fig. 4]
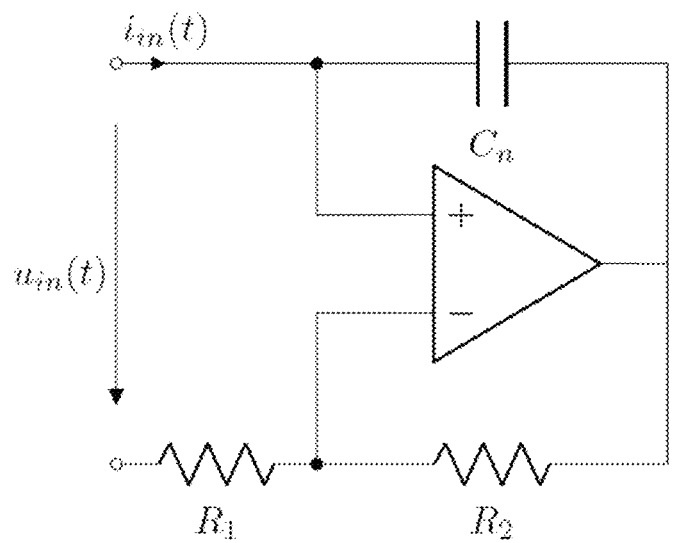

[Fig. 5A]
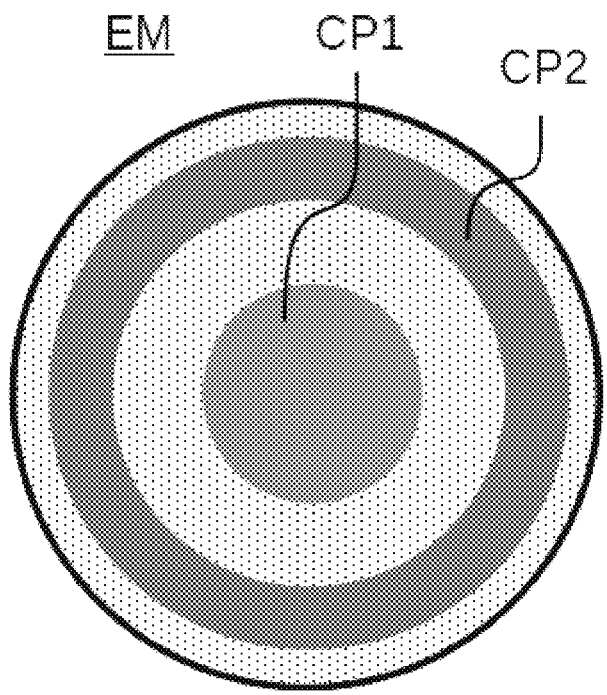
[Fig. 5B]
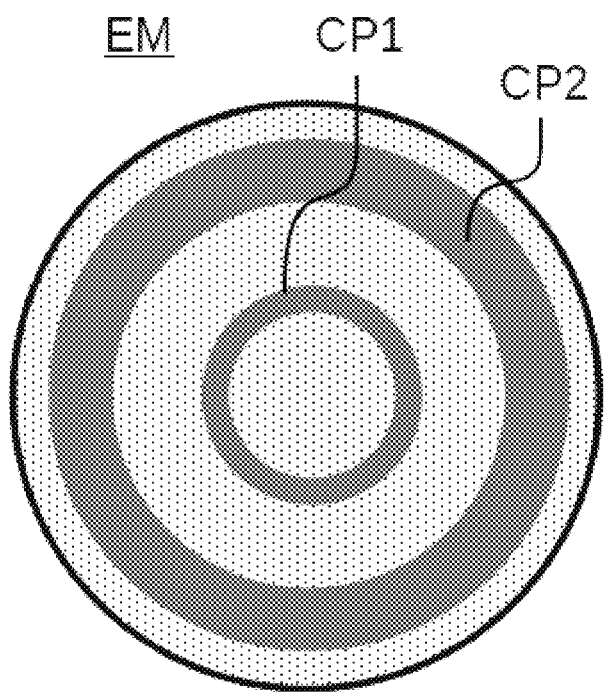

[Fig. 6]
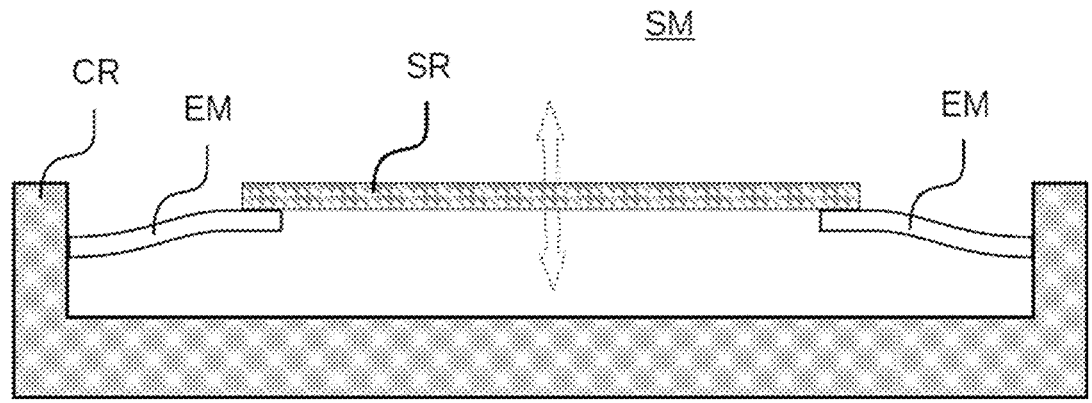
[Fig. 7]
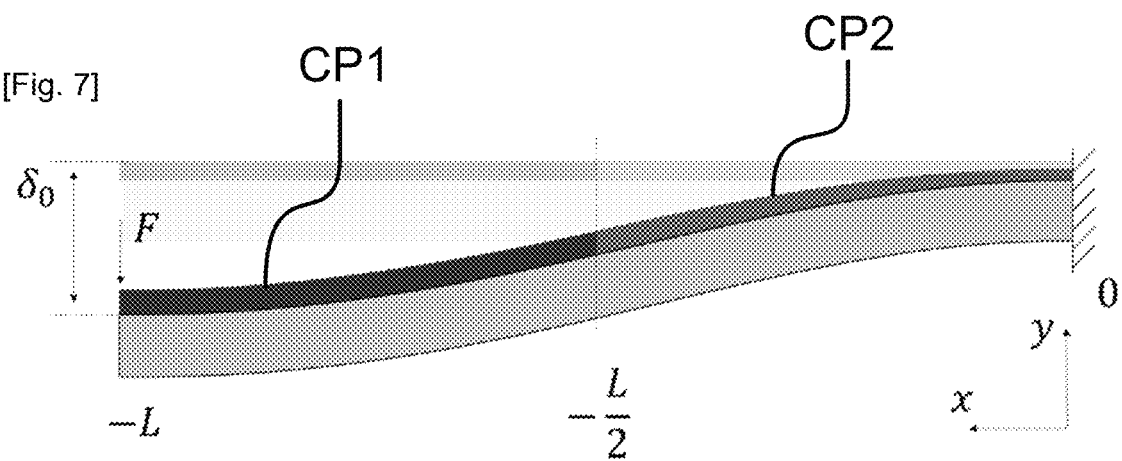
[Fig. 8]
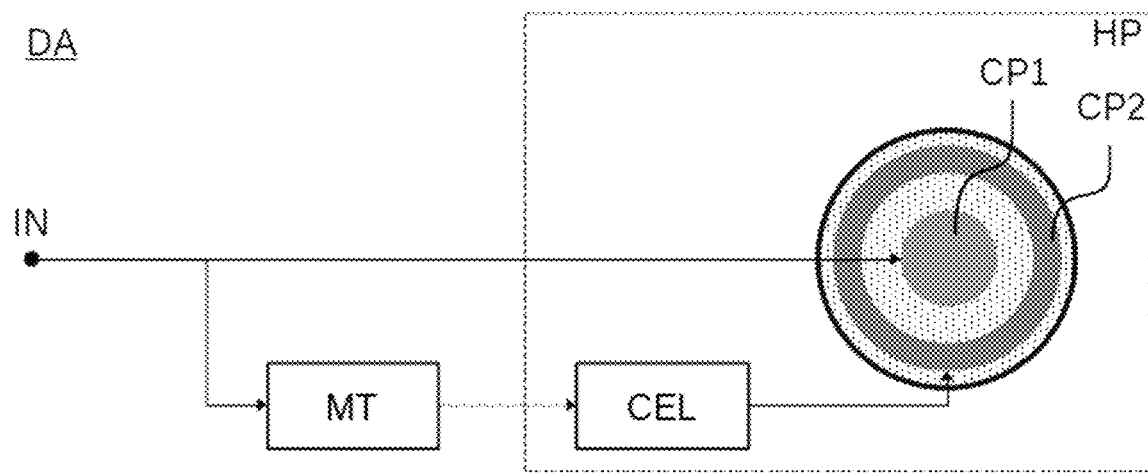

[Fig. 9]
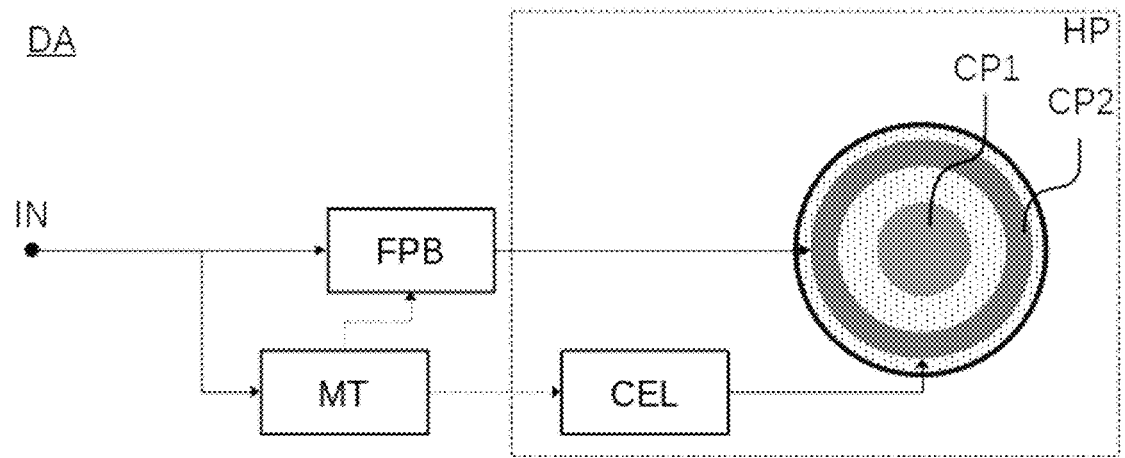
[Fig. 10]
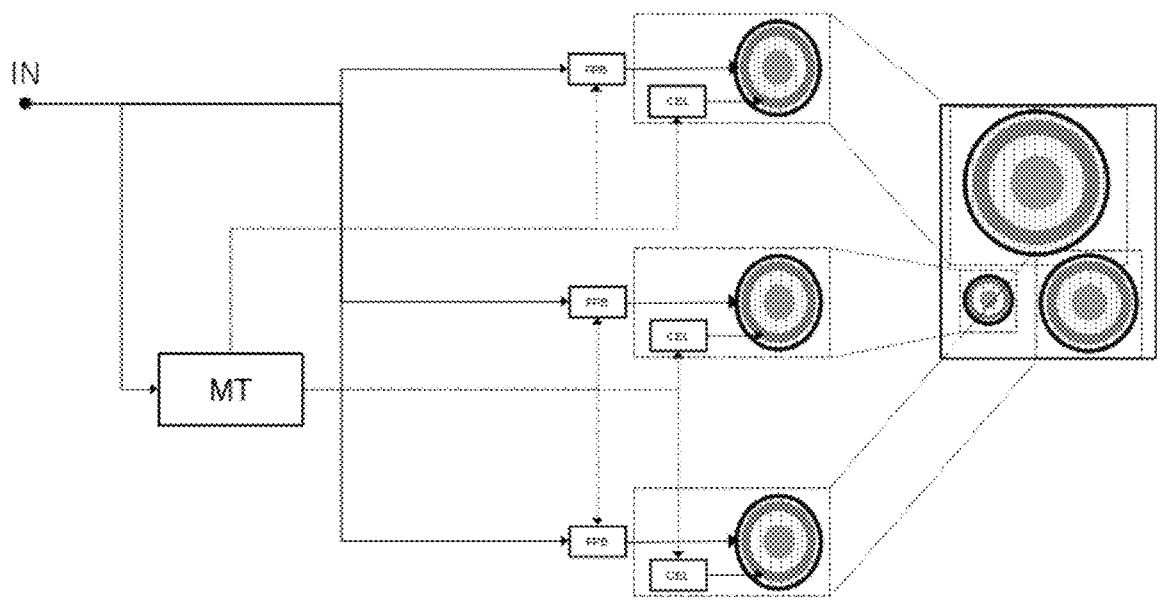

[Fig. 11]
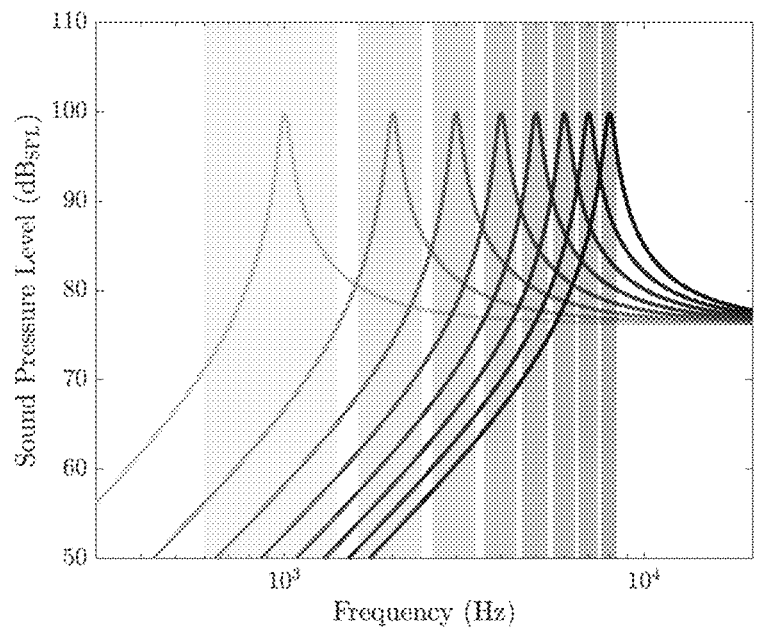
[Fig. 12]
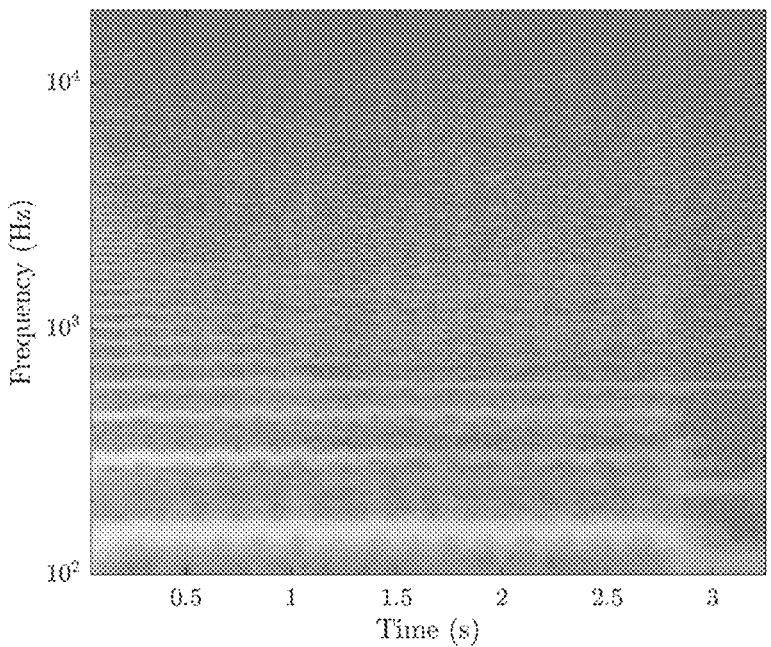

VARIABLE RESONANT FREQUENCY ELECTROMECHANICAL DEVICE AND ASSOCIATED ACOUSTIC DEVICE

CROSS-REFERENCE TO RELATED APPLICATIONS

This application claims priority to French Patent Application No. 2213178, filed Dec. 12, 2022, the entire content of which is incorporated herein by reference in its entirety.

FIELD

The technical field of the invention is that of microsystems, in particular microsystems for acoustic applications.

The present invention relates to an electromechanical device and, in particular, an electromechanical device whose resonant frequency can be modulated. The present invention also relates to an acoustic device making use of an electromechanical device according to the invention.

BACKGROUND

A loudspeaker is used to transform an electrical signal into sound pressure. For many years, loudspeakers have been miniaturised for incorporation into computers, mobile phones and wireless headphones. More particularly, the loudspeaker is an electro-mechano-acoustic transducer. In its linear principle, the operation of the loudspeaker resorts to actuation of a membrane, coupled to ambient air. The electrical signal passes through a first electromechanical transducer, which converts the voltage into displacement. A mechanical-acoustic transducer, very often a membrane, then converts this displacement into sound pressure.

A good loudspeaker reproduces all the frequencies in the audio band (20 Hz to 20 kHz) at the same amplitude, with a low distortion rate. In practice, the lowest frequency at which a loudspeaker effectively produces sound is determined by the resonant frequency of the mechanical-acoustic transducer. In the context of miniaturisation, the membrane guide system is more rigid and the mass of the membrane is lower, which increases resonant frequency therefore reduces bandwidth of the system. In addition, to avoid destructive interference between the acoustic front and rear waves of the loudspeaker, a hermetic cavity is required. This hermetic cavity increases the apparent stiffness of the system and therefore its resonant frequency, thus reducing its bandwidth.

Furthermore, the level of pressure radiated by a loudspeaker depends on the volume of air accelerated by the loudspeaker. The volume of air accelerated in turn depends on the product of the surface area and the maximum displacement of the membrane. In a context of miniaturisation, the surface area of the membrane is greatly reduced, and a large displacement is therefore necessary to obtain a satisfactory pressure level.

To achieve large displacements, electromagnetic transduction remains the solution of choice, and is used in the vast majority of loudspeakers. Although this type of loudspeaker shows good performance, their dimensions do not allow them to be integrated into portable systems. In addition, the use of a magnet makes the manufacture of these loudspeakers incompatible with micro-fabrication methods.

Another transduction means showing noticeable performance is piezoelectric transduction. Although it does not provide displacements as large as electromagnetic transduction, piezoelectric transduction has the advantage of being compatible with micro-fabrication methods. For example, it is possible to use the bimetal effect and an actuator positioned on a membrane to obtain relatively large displacements. However, this is not the only possible configuration. For example, in another configuration, the piezoelectric actuators are offset from the membrane, this solution making it possible to produce a "pistonic" movement of the membrane (see for example U.S. Pat. No. 9,980,051B2).

However, solutions in the state of the art have limitations, especially in terms of frequency response. FIG. 1 shows the frequency response of a MEMS loudspeaker, with and without a 100 mm$^3$ back cavity. Increasing the resonant frequency removes much of the pressure radiated at low frequencies.

There is therefore a need for an electromechanical device whose frequency can be varied, and especially lowered, as required. There is also a need for an acoustic device equipped with such an electromechanical device so as to have a loudspeaker whose resonant frequency can be varied, thus making it possible to reproduce all the frequencies of the audio band with substantially the same amplitude, with a low distortion rate, the loudspeaker being furthermore compatible with micro-fabrication techniques.

SUMMARY

An aspect of the invention offers a solution to the problems discussed above, by providing an electromechanical device whose frequency can be varied, and especially lowered, as required. The invention also provides an acoustic device which makes use of such an electromechanical device and wherein the resonant frequency of the loudspeaker or loudspeakers adapts to the frequency or frequencies of the acoustic signal emitted by said loudspeaker or loudspeakers.

For this, a first aspect of the invention relates to an electromechanical device comprising:
  at least one movable mechanical structure comprising at least one movable mechanical element;
  for each movable mechanical element of each movable mechanical structure:
    a first piezoelectric layer, said first layer being disposed on a first part of the movable mechanical element so as to be able to actuate said movable mechanical element;
    a second piezoelectric layer, said second layer being disposed on a second part of the movable mechanical element, distinct from the first part, so as to be able to convert mechanical energy associated with the movement of the movable mechanical element into electric energy, said second layer forming a capacitance;

The electromechanical device according to the invention is remarkable in that it comprises an electrical circuit connected to the second piezoelectric layer in parallel with the capacitance formed by said second layer and including an adjustable capacitance that can assume a negative value.

By virtue of an aspect of the invention, it is possible to vary the resonant frequency of the movable element(s) (and therefore of the movable mechanical structure) by varying the value of the adjustable capacitance.

Further to the characteristics just discussed in the preceding paragraph, the electromechanical device according to a first aspect of the invention may have one or more additional characteristics from among the following, considered individually or according to any technically possible combinations.

In an embodiment, the adjustable capacitance that can assume a negative value is implemented by means of an operational amplifier.

In an embodiment, the adjustable capacitance that can assume a negative value is made by micro-fabrication.

In an embodiment, the movable mechanical structure comprises a movable mechanical element in the form of a disc-shaped membrane, the first piezoelectric layer and the second piezoelectric layer being disposed on the surface of the membrane.

In an embodiment, the movable mechanical structure comprises a rigid surface configured to be capable of translational movement perpendicular to its surface, the movable mechanical element(s) of the movable mechanical structure being configured to actuate the rigid surface according to said movement.

In an embodiment, each movable mechanical element is formed using a beam embedded at one end thereof and guided, the first piezoelectric layer being disposed on a first part of an upper surface of the beam and the second piezoelectric layer being disposed on a second part of the upper surface of the beam.

In an embodiment, each movable element is formed by a beam embedded at both ends thereof.

A second aspect of the invention relates to an acoustic device comprising:
    an input port for receiving an electrical audio signal;
    a loudspeaker comprising an electromechanical device according to a first aspect of the invention, the loudspeaker being associated with a rest resonant frequency and comprising a measurement device configured to measure movement of the loudspeaker; and
    a digital signal processing system or processor configured to determine instantaneous frequency of the electrical audio signal received at the input port.

Furthermore, in the acoustic device according to the invention, the resonant frequency of the loudspeaker is adjustable about the rest frequency of the loudspeaker and the digital signal processor is configured to send the instantaneous frequency of the signal to the loudspeaker, the same being configured to adjust its resonant frequency to the instantaneous frequency of the electrical audio signal received at the input port.

By "electrical audio signal», it is meant an electrical signal corresponding to an electrical signal for being converted into an audio signal by one or more loudspeakers.

Further to the characteristics just discussed in the preceding paragraph, the acoustic device according to a second aspect of the invention may have one or more additional characteristics from among the following, considered individually or according to any technically possible combinations.

In an embodiment, the acoustic device comprises a bandpass filter configured to isolate, in the electrical audio signal received at the input port, the electrical audio signal at a predetermined frequency, the electrical signal at the output of the bandpass filter being sent to the loudspeaker, the bandpass filter being configured to adjust its predetermined frequency to the instantaneous frequency of the signal received at the input port and determined by the digital signal processor.

A third aspect of the invention relates to an acoustic device comprising:
    an input port for receiving an electrical audio signal;
    a plurality of loudspeakers, each loudspeaker of the plurality of loudspeakers comprising an electromechanical device according to a first aspect of the invention, each loudspeaker being associated with a rest resonant frequency, different from the rest resonant frequency of the other loudspeakers, and comprising a measurement device configured to measure movement of the loudspeaker considered;
    a digital signal processing system or processor configured to determine the frequency content of the electrical audio signal received at the input port; and
    for each loudspeaker of the plurality of loudspeakers, a bandpass filter configured to isolate, in the electrical audio signal received at the input port, the electrical audio signal at a predetermined frequency, the electrical signal at the output of the bandpass filter being sent to the loudspeaker considered.

Furthermore, in the device according to a third aspect of the invention, the resonant frequency of each loudspeaker of the plurality of loudspeakers is adjustable about the rest resonant frequency of the loudspeaker considered within a predetermined frequency range, and the digital signal processing system or processor is configured to send, to each loudspeaker of the plurality of loudspeakers, the instantaneous frequency of the signal received at the input port having the highest amplitude in the predetermined frequency range associated with the loudspeaker considered, the same being configured to adjust its resonant frequency to this instantaneous frequency, the bandpass filter associated with the loudspeaker considered being configured to adjust its predetermined frequency to this same instantaneous frequency.

Further to the characteristics just discussed in the preceding paragraph, the acoustic device according to a third aspect of the invention may have one or more additional characteristics from among the following, considered individually or according to any technically possible combinations.

In an embodiment, the rest resonant frequencies of the loudspeakers of the plurality of loudspeakers are distributed according to harmonics of a stringed instrument.

The invention and its different applications will be better understood upon reading the following description and upon examining the accompanying figures.

BRIEF DESCRIPTION OF THE FIGURES

The figures are set forth by way of indicating and in no way limiting purposes of the invention.

FIG. 1 illustrates the change in sound pressure associated with the presence of a cavity.

FIG. 2 illustrates an equivalent diagram of an electromechanical device according to an aspect of the invention.

FIG. 3 illustrates the course of the resonant frequency as a function of the value of the adjustable capacitance of an electromechanical device according to an aspect of the invention.

FIG. 4 illustrates the adjustable capacitance using an operational amplifier in one embodiment of an electromechanical device according to an aspect of the invention.

FIG. 5A and FIG. 5B illustrate one embodiment in which the movable structure is made using a circular membrane.

FIG. 6 illustrates one embodiment wherein the mechanical structure comprises a rigid membrane actuated by cantilevers.

FIG. 7 illustrates one embodiment of a cantilever comprising, on its upper surface, a first piezoelectric layer and a second piezoelectric layer.

FIG. 8 schematically illustrates the operating principle of an acoustic device according to the invention without a bandpass filter.

FIG. 9 schematically illustrates the operating principle of an acoustic device according to the invention with a band-pass filter.

FIG. 10 schematically illustrates the operating principle of an acoustic device according to the invention with a plurality of loudspeakers.

FIG. 11 illustrates a possible distribution of resonant frequencies and frequency ranges associated with a plurality of loudspeakers (8 loudspeakers) of an acoustic device according to an aspect of the invention.

FIG. 12 represents the amplitude of the time/frequency signal of an acoustic device according to an aspect of the invention.

DETAILED DESCRIPTION

Unless otherwise specified, a same element appearing in different figures has a single reference.

Variable Resonant Frequency Electromechanical Device

A first aspect of the invention illustrated in FIG. 2 to FIG. 7 relates to an electromechanical device comprising at least one movable mechanical structure SM (hereinafter movable structure), the movable structure SM including at least one movable mechanical element EM (hereinafter movable element) and, for each of these movable elements EM, a first piezoelectric layer CP1, the first layer CP1 being disposed on a first part of the movable element EM so as to be able to actuate the movable element EM, and a second piezoelectric layer CP2, the second layer CP2 being disposed on a second part of the movable element EM, distinct from the first part, so as to be able to convert mechanical energy associated with the movement of the movable element EM into electric energy (thus the first layer CP1 and the second layer CP2 are separated from each other), the second layer CP2 forming a capacitance. The electromechanical device according to an aspect of the invention is remarkable in that it comprises an electrical circuit CEL connected to the second piezoelectric layer CP2, said electrical circuit including an adjustable capacitance which can assume a negative value. Furthermore, this adjustable capacitance is in parallel with the capacitance formed by the second piezoelectric layer CP2, so that the equivalent capacitance can assume a positive value or a negative value as required.

In order to understand benefits resulting from an electromechanical device according to the invention, it is interesting to note that a piezoelectric layer CP1, CP2 acts as a transducer. Hence, the electrical components connected to such a layer have an influence on the mechanical behaviour of the movable element EM onto which the piezoelectric layer CP1, CP2 is deposited.

The behaviour of the movable element EM can thus be modelled by an equivalent electrical diagram such as that illustrated in FIG. 2. In this diagram, the electromechanical structure according to an aspect of the invention is represented by an equivalent electrical circuit comprising a series resistance $R_g$ representing the output resistance of the amplifier (in charge of actuating the movable element EM), a capacitor $C_{pa}$ representing the capacitive effect of the first piezoelectric layer CP1, a transformer $\gamma_a$ representing the electromechanical transduction of the first piezoelectric layer CP1 (in other words, representing conversion of electric energy provided by the amplifier into mechanical energy of the movable element EM), a resistance $R_{ms}$ representing viscous losses in the mechanical domain undergone by the movable element EM, an inductance $M_{ms}$ representing the movable mass of the movable element EM, a capacitance $C_{ms}$ representing the apparent stiffness of the movable element EM with respect to the attachment point or points of said movable element EM, a transformer Sa representing the mechano-acoustic transduction, an impedance $Z_{rad}$ representing the radiation impedance of the movable element EM, a capacitance $C_{ps}$ representing the capacitive effect of the second piezoelectric layer CP2 and a capacitance C) in parallel with the capacitance created by the second piezoelectric layer CP2 and able to assume negative values (this aspect will be detailed later).

Since the second piezoelectric layer CP2 has an influence on the behaviour of the movable element EM, connecting this second layer CP2 to a capacitance Cn, with a negative value reduces the apparent stiffness of the movable element EM and therefore changes its resonant frequency. From the above equivalent diagram, it is possible to express the resonant frequency of the movable element EM using the following relationship:

$$f_s = \frac{1}{2\pi\sqrt{M_{ms}C_{eq}}} \quad \text{[Math. 1]}$$

where $M_{ms}$ is the equivalent mass of the movable element EM and $C_{eq}$ is the equivalent capacitance of the circuit given by the following relationship:

$$C_{eq} = \frac{1}{\frac{1}{C_{ms}} + \left(\frac{1}{C_{ps}+C_n}\right)\gamma_s^2} \quad \text{[Math. 2]}$$

It is therefore possible to increase or decrease the resonant frequency of the movable element EM by varying the negative value of the capacitance Cy, as shown in FIG. 3. In this figure, the frequency response of the movable element EM is represented for different values of $C_{ps}$+Cn between −1 nF and −10 nF. In an embodiment, values of the capacitances are chosen so that the resonant frequency can be varied within a range of +/−20% about the rest resonant frequency (corresponding to the situation in which the circuit CEL in parallel with the capacitance formed by the second layer is open).

In an embodiment illustrated in FIG. 4, the adjustable capacitance is made using an operational amplifier. The impedance thus obtained is given by the following relationship:

$$C_n = -\frac{R_2}{R_1}C'_n \quad \text{[Math. 3]}$$

where $R_1$, $R_2$ and $C'_n$ assume positive values, at least one of which may vary. In an embodiment, the value of $C'_n$ can be varied.

The movable structure SM according to an aspect of the invention can adopt different configurations depending on the use contemplated.

In an embodiment illustrated in FIG. 5A and FIG. 5B, the movable structure SM consists of a movable element EM in the form of a disc-shaped membrane, the first piezoelectric layer CP1 and the second piezoelectric layer CP2 being disposed on the surface of said membrane. In one embodiment, the diameter of the disc-shaped membrane is between 1 mm and 25 mm. In an embodiment, the first piezoelectric layer CP1 is located in a part of the surface of the membrane separated from the part of the surface of the membrane where the second piezoelectric layer CP2 is located, the separation between both parts being at the inflection of the membrane (in a cross-section along the diameter thereof), generally ⅔ of the radius from the centre of the membrane. In one embodiment illustrated in FIG. 5A, the first piezoelectric layer CP1 forms a disc in the centre of the membrane and the second piezoelectric layer CP2 forms a ring about this disc. In an alternative embodiment illustrated in FIG. 5B, the first layer CP1 forms a first ring and the second layer CP2 forms a second ring surrounding the first ring.

In an embodiment illustrated in FIG. 6, the movable structure SM comprises a rigid surface SR configured to be able to perform a translational movement perpendicular to its surface (movement represented by the dotted arrow in the figure), the movable element(s) EM of the structure SM being configured to actuate the rigid surface SR according to said movement. It will be appreciated that the equivalent electrical diagram and the operating principle remain the same as in the case introduced previously: the influence of the second piezoelectric layer CP2 present on each movable element EM makes it possible to change resonant frequency of the movable structure SM as a whole.

In an embodiment illustrated in FIG. 7, each movable element EM is made using a beam embedded at one end thereof at a frame CR and guided (given the symmetry of the structure), the first piezoelectric layer CP1 being disposed on a first part of an upper surface of the beam and the second piezoelectric layer CP2 being disposed on a second part of the upper surface of the beam, distinct from the first part. In an embodiment, the boundary between the first part and the second part is located at an inflection point of the beam (when the beam is moved). In the example of FIG. 7, given the symmetry of the beam, this boundary is located at mid-length of the beam, that is at a distance L/2 from one end of the beam, L being the length of the beam.

In an alternative embodiment, each movable element is made using a beam embedded at both ends thereof.

An electromechanical device according to the invention can beneficially be used to make a loudspeaker with a variable resonant frequency, the resonant frequency of the loudspeaker being given by the frequency of the electromechanical device of said loudspeaker. Similarly, it is possible to make a plurality of loudspeakers, each loudspeaker being made with an electromechanical device according to the invention and associated with a rest resonant frequency, for example different for each loudspeaker. In an embodiment, each loudspeaker HP comprises a movable structure SM made using a membrane as represented in FIG. 5A or FIG. 5B. In an embodiment, each loudspeaker HP comprises a control circuit configured to determine, from a frequency setpoint, the value of the negative capacitance for obtaining a resonant frequency equal to the frequency setpoint, the control circuit being further configured to control the electrical circuit CEL of the electromechanical device according to the invention in order to obtain the desired capacitance value (and therefore resonant frequency). In addition, the control circuit is configured to determine movement of the loudspeaker by means of the second piezoelectric layer CP2 and, from this movement, the vibration frequency of the loudspeaker.

Acoustic Device Comprising a Variable Resonant Frequency Electromechanical Device The electromechanical device according to an aspect of the invention can beneficially be used in an acoustic device in order to obtain an acoustic device comprising a loudspeaker whose resonant frequency can be modulated (that is a loudspeaker as previously set forth). For this, a second aspect of the invention illustrated in FIG. 8 relates to an acoustic device DA comprising:
- an input port IN for receiving an electrical audio signal;
- a loudspeaker HP comprising an electromechanical device according to the invention, the loudspeaker HP being associated with a rest resonant frequency and comprising a measurement device CP2 configured to measure movement of the loudspeaker HP; and
- a digital signal processing system or processor MT configured to determine instantaneous frequency of the electrical audio signal received at the input port IN.

Furthermore, in the device according to a second aspect of the invention, the resonant frequency of the loudspeaker HP is adjustable about the rest frequency of said loudspeaker HP and the digital signal processing system or processor MT is configured to send the instantaneous frequency of the signal to the loudspeaker HP, the same being configured to adjust its resonant frequency on the basis of this instantaneous frequency.

The acoustic device DA according to an aspect of the invention can, for example, be integrated into a mobile phone, a tablet or any other equipment requiring small loudspeakers and/or only needing to reproduce a single frequency although variable over time (e.g. a buzzer in an electronic device).

In the device according to a second aspect of the invention, the loudspeaker being made using an electromechanical device DE according to a first aspect of the invention, it is possible to control the frequency thereof by means of the electrical circuit CEL of the electromechanical device DE and to measure movement of the loudspeaker HP (and possibly, from this movement to deduce the vibration frequency therefrom) and to control the variable capacitance in order to adjust the resonant frequency of the loudspeaker HP.

In an embodiment illustrated in FIG. 9, the acoustic device DA comprises a bandpass filter FPB configured to isolate, in the electrical audio signal received at the input port IN, the electrical audio signal at a predetermined frequency, the electrical signal filtered at the output of the filter being sent to the loudspeaker HP. In addition, the predetermined frequency of the bandpass filter FPB is adjusted as a function of the instantaneous frequency of the electrical audio signal received at the input port IN. In this way, when the input signal is not monotonic, the bandpass filter FPB can filter out parasitic signals so that only the signal at the instantaneous frequency of the input signal is sent to the loudspeaker, the same additionally being the resonant frequency of the loudspeaker. Stated differently, the predefined frequency of the bandpass filter FPB and the resonant frequency of the loudspeaker are feedback controlled to the instantaneous frequency of the input signal.

In an embodiment, the instantaneous frequency of the input electrical audio signal is determined using a Short-Time Fourier Transform (STFT). It will be appreciated that this is just one example. Other methods well known to those skilled in the art can be used, such as a Hilbert Transform or even a derivative of the phase as a function of time.

In the previous embodiments, the acoustic device DA is configured only to emit a single frequency, the instantaneous frequency of the input signal (this frequency can, however, vary over time). However, it may be useful to be able to transmit at a plurality of frequencies, for example to reproduce the sound emitted by a stringed instrument or to vary tones of a buzzer.

For this, a third aspect of the invention illustrated in FIG. 10 (for an example in which three loudspeakers are present—it will be appreciated that the device may include a greater number of loudspeakers) relates to an acoustic device DA comprising:

- an input port IN for receiving an electrical audio signal;
- a plurality of loudspeakers HP, each loudspeaker HP of the plurality of loudspeakers HP comprising an electromechanical device according to an aspect of the invention, the loudspeaker HP being associated with a rest resonant frequency, different from the rest resonant frequency of the other loudspeakers HP and comprising a measurement device CP2 configured to measure movement of the loudspeaker HP considered;
- a digital signal processing system or processor MT configured to determine the frequency content of the electrical audio signal received at the input port IN; and
- for each loudspeaker HP of the plurality of loudspeakers HP, a bandpass filter FPB configured to isolate, in the electrical audio signal received at the input port IN, the electrical audio signal at a predetermined frequency, the electrical signal filtered at the output of the bandpass filter FPB being sent to the loudspeaker HP considered.

Furthermore, the acoustic device DA according to an aspect of the invention is remarkable in that the resonant frequency of each loudspeaker HP of the plurality of loudspeakers HP is adjustable about the rest resonant frequency of the loudspeaker HP considered within a predetermined frequency range, and in that the digital signal processing device MT is configured to send, to each loudspeaker HP of the plurality of loudspeakers HP, the instantaneous frequency of the signal received at the input port IN having the highest amplitude in the predetermined frequency range associated with the loudspeaker HP considered, said loudspeaker HP being configured to adjust its resonant frequency to this instantaneous frequency. In addition, the bandpass filter FPB associated with the loudspeaker HP considered is configured to adjust its predetermined frequency to this same instantaneous frequency. Stated differently, of all the frequencies present in the signal that are in the frequency band compatible with the loudspeaker HP considered, the frequency associated with the greatest signal amplitude is the one on which the resonant frequency of the loudspeaker HP and the predefined frequency of the bandpass filter FPB will be feedback controlled.

As already mentioned, each loudspeaker HP of the plurality of loudspeakers HP is associated with a rest resonant frequency, different from the rest resonant frequency of the other loudspeakers HP. In addition, each loudspeaker of the plurality of loudspeakers is adjustable about the rest resonant frequency of the loudspeaker considered within a predetermined frequency range (this frequency range thus defining a frequency band). FIG. 11 represents the frequency response of eight loudspeakers, each curve being associated with one loudspeaker, each peak corresponding to the rest resonant frequency of the loudspeaker, the grey band surrounding each peak representing the frequency band of the loudspeaker in which the resonant frequency can be adjusted.

In an exemplary embodiment, the rest resonant frequencies of the loudspeakers HP of the plurality of loudspeakers HP are distributed according to harmonics of a stringed instrument, for example a guitar, piano, etc. As illustrated in FIG. 12, which represents the amplitude of the signal in time/frequency, such a device DA makes it possible to reproduce (apart from attack) guitar notes with a vibrato.

It will be appreciated that the various embodiments and aspects of the inventions described previously are combinable according to any technically permissible combinations.

The articles "a" and "an" may be employed in connection with various element, components, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

The invention claimed is:

1. An electromechanical device comprising:
   at least one movable mechanical structure comprising at least one movable mechanical element;
   for each movable mechanical element of each movable mechanical structure:
   a first piezoelectric layer, said first piezoelectric layer being disposed on a first part of the movable element so as to be able to actuate said movable mechanical element;
   a second piezoelectric layer, said second piezoelectric layer being disposed on a second part of the movable element, distinct from the first part, so as to be able to convert mechanical
   energy associated with a movement of the movable mechanical element into electric energy, said second piezoelectric layer forming a capacitance, and
   an electrical circuit connected to the second piezoelectric layer in parallel with the capacitance formed by said second piezoelectric layer and including an adjustable capacitance which is adapted to assume a negative value.

2. The electromechanical device according to claim 1, wherein the adjustable capacitance which is adapted to assume a negative value is made using an operational amplifier.

3. The electromechanical device according to claim 1, wherein the adjustable capacitance which is adapted to assume a negative value is made by micro-fabrication.

4. The electromechanical device according to claim 1, wherein the at least one movable mechanical structure consists of a movable element in form of a disc-shaped membrane, the first piezoelectric layer and the second piezoelectric layer being disposed on a surface of said disc-shaped membrane.

5. The electromechanical device according to claim 4, wherein the first piezoelectric layer forms a first ring and the second piezoelectric layer forms a second ring surrounding the first ring.

6. The electromechanical device according to claim 1, wherein the at least one movable mechanical structure comprises a rigid surface configured to be able to perform translational movement perpendicular to its surface, the at least one movable mechanical element of the at least one movable mechanical structure being configured to actuate the rigid surface according to said translational movement.

7. The electromechanical device according to claim 6, wherein each movable element is made by a beam embedded at one end thereof and guided, the first piezoelectric layer being disposed on a first part of an upper surface of the beam and the second piezoelectric layer being disposed on a second part of the upper surface of the beam, distinct from the first part.

8. The electromechanical device according to claim 6, wherein each movable mechanical element is made by a beam embedded at both ends thereof.

9. A loudspeaker comprising at least one electromechanical device according to claim 1.

10. An acoustic device comprising:
an input port for receiving an electrical audio signal;
a loudspeaker according to claim 9, said loudspeaker being associated with a rest resonant frequency and comprising a measurement device configured to measure movement of the loudspeaker;
a digital signal processor configured to determine instantaneous frequency of the electrical audio signal received at the input port;
wherein a resonant frequency of the loudspeaker is adjustable about a rest frequency of said loudspeaker and the digital signal processor is configured to send the instantaneous frequency of the signal to the loudspeaker, the loudspeaker being configured to adjust its resonant frequency on the basis of said instantaneous frequency.

11. The acoustic device according to claim 10, comprising a bandpass filter configured to isolate, in the electrical audio signal received at the input port, the electrical audio signal at a predetermined frequency, an electrical signal at an output of the bandpass filter being sent to the loudspeaker, the bandpass filter being configured to adjust its predetermined frequency to the instantaneous frequency of the electrical audio signal received at the input port.

12. An acoustic device comprising:
an input port for receiving an electrical audio signal;
a plurality of loudspeakers according to claim 9, each loudspeaker of the plurality of loudspeakers being associated with a rest resonant frequency, different from the rest resonant frequency of the other loudspeakers and comprising a measurement device configured to measure movement of the loudspeaker;
a digital signal processor configured to determine a frequency content of the electrical audio signal received at the input port;
for each loudspeaker of the plurality of loudspeakers, a bandpass filter configured to isolate, in the electrical audio signal received at the input port, the electrical audio signal at a predetermined frequency, an electrical signal at an output of the bandpass filter being sent to the loudspeaker;
wherein a resonant frequency of each loudspeaker of the plurality of loudspeakers is adjustable about the rest resonant frequency of the loudspeaker within a predetermined frequency range, and the digital signal processor is configured to send, to each loudspeaker of the plurality of loudspeakers, an instantaneous frequency of the signal received at the input port having the highest amplitude in the predetermined frequency range associated with the loudspeaker, said loudspeaker being configured to adjust its resonant frequency to said instantaneous frequency, the bandpass filter associated with the loudspeaker being configured to adjust its predetermined frequency to this same instantaneous frequency.

13. The acoustic device according to claim 12, wherein the rest resonant frequencies of the loudspeakers of the plurality of loudspeakers are distributed as a function of harmonics of a stringed instrument.

* * * * *